United States Patent
Kim et al.

(10) Patent No.: US 10,627,452 B2
(45) Date of Patent: Apr. 21, 2020

(54) APPARATUS AND METHOD FOR STATE OF CHARGE (SOC) DETERMINATION FOR BATTERY

(71) Applicant: Samsung Electronics Co., Ltd., Suwon-si (KR)

(72) Inventors: Jin Ho Kim, Yongin-si (KR); Tae Won Song, Yongin-si (KR); Tae Jung Yeo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 376 days.

(21) Appl. No.: 15/236,657

(22) Filed: Aug. 15, 2016

(65) Prior Publication Data

US 2017/0045587 A1 Feb. 16, 2017

(30) Foreign Application Priority Data

Aug. 13, 2015 (KR) .................. 10-2015-0114765

(51) Int. Cl.
*G01R 31/396* (2019.01)
*G01R 31/367* (2019.01)
(Continued)

(52) U.S. Cl.
CPC ......... *G01R 31/396* (2019.01); *G01R 31/367* (2019.01); *G01R 31/387* (2019.01);
(Continued)

(58) Field of Classification Search
CPC ............ G01R 31/3658; G01R 31/3634; G01R 31/3651; H01M 10/482; H01M 10/486
See application file for complete search history.

(56) References Cited

U.S. PATENT DOCUMENTS 8,598,847 B2   12/2013   Eberhard et al.
8,972,091 B2   3/2015   Li et al.
(Continued)

FOREIGN PATENT DOCUMENTS

JP   2008-99492 A    4/2008
JP   2012-175733 A   9/2012
(Continued)

OTHER PUBLICATIONS

Hautamäki et al., Improving K-Means by Outlier Removal, SCIA 2005, LNCS 3540, pp. 978-987, 2005.*
(Continued)

*Primary Examiner* — Daniel R Miller
(74) *Attorney, Agent, or Firm* — NSIP Law (57) ABSTRACT

Battery state of charge (SOC) determination apparatuses and methods are disclosed, where the battery SOC determination apparatus includes a grouper configured to cluster the cells in the battery pack into the groups based on similarity of the sensing data among the cells, a representative cell selector configured to select the representative cell for the each group, a first SOC estimator configured to estimate the SOC of the representative cell of the each group based on the battery model, and a second SOC estimator configured to determine the SOC of the battery pack based on the SOC of the representative cell of the each group.

17 Claims, 11 Drawing Sheets

(51) Int. Cl.
- *G01R 31/387* (2019.01)
- *H01M 10/48* (2006.01)
- *G01R 31/3828* (2019.01)

(52) U.S. Cl.
CPC ....... *H01M 10/482* (2013.01); *H01M 10/486* (2013.01); *G01R 31/3828* (2019.01)

(56) References Cited

U.S. PATENT DOCUMENTS

| | | |
|---|---|---|
| 2009/0013521 A1 | 1/2009 | Okumura et al. |
| 2011/0226559 A1* | 9/2011 | Chen ................. G01R 31/3651 187/290 |
| 2014/0277866 A1 | 9/2014 | Li et al. |
| 2014/0361743 A1 | 12/2014 | Lin et al. |

FOREIGN PATENT DOCUMENTS

| | | |
|---|---|---|
| JP | 2015-80334 A | 4/2015 |
| WO | WO 2015/056068 A1 | 4/2015 |

OTHER PUBLICATIONS

Xiong, Rui, and Hongwen He. "Cell State-of-Charge Estimation for the Multi-cell Series-connected Battery Pack with Model blas Correction Approach," Energy Procedia 61 (2014): 172-175. (4 pages in English).

\* cited by examiner

APPARATUS AND METHOD FOR STATE OF CHARGE (SOC) DETERMINATION FOR BATTERY

CROSS-REFERENCE TO RELATED APPLICATION(S)

This application claims the benefit under 35 U.S.C. § 119(a) of Korean Patent Application No. 10-2015-0114765, filed on Aug. 13, 2015, in the Korean Intellectual Property Office, the entire disclosure of which is incorporated herein by reference for all purposes.

BACKGROUND

1. Field

The following description relates to battery management, and to an apparatus and method for state of charge (SOC) estimation for a battery.

2. Description of the Related Art

State of charge (SOC) for a multi-cell battery pack may be estimated by various methods, such as, for example, coulomb counting, an electric circuit model-based method, an electro-chemical model-based method, and a data-based method. The coulomb counting and the electric circuit model have generally been used for SOC estimation, but recently the use of the electro-chemical model and the data-based method is increasing.

The coulomb counting and the electric circuit model-based method allow relatively fast and simple SOC estimation, but show reduced estimation accuracy if a battery is degraded or is in low/high temperatures. As an alternative, an electro-chemical model that allows the estimation of deterioration properties and low-temperature properties based on physical properties is being used as a battery SOC estimation model. The electro-chemical model, however, requires a considerable amount of computation, and hence there is still a need for a method to increase speed of computation as well as to reduce the amount of computation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an apparatus for battery state of charge (SOC) determination, the apparatus including a processor configured to cluster cells in a battery pack into groups based on similarity of sensing data among the cells, select a representative cell for each group, estimate a SOC of the representative cell of each group based on a battery model, and determine a SOC of the battery pack based on the SOC of the representative cell of the each group.

The processor may include a grouper configured to cluster the cells in the battery pack into the groups based on similarity of the sensing data among the cells, a representative cell selector configured to select the representative cell for the each group, a first SOC estimator configured to estimate the SOC of the representative cell of the each group based on the battery model, and a second SOC estimator configured to determine the SOC of the battery pack based on the SOC of the representative cell of the each group.

The sensing data of each of the cells may include any one or any combination of a current, a voltage, and a temperature of the each cell.

The grouper may be configured to cluster the cells into the groups at designated group update intervals.

The representative cell selector may be configured to select the representative cell of the each group at designated representative cell update intervals.

The representative cell selector may be configured to either number the cells in a group and to select each of the numbered cells in turn as the representative cell at the representative cell update intervals, or to randomly select a cell from the each group as the representative cell at the representative cell update intervals.

The battery model may include either an electric circuit model or an electro-chemical model.

The second SOC estimator may be configured to estimate a SOC of each cell in the each group based on the estimated SOC of the representative cell of the each group, and to estimate the SOC of the battery pack based on the SOC of each of the cells and the SOC of the each of the representative cells.

The second SOC estimator may be configured to estimate the SOC of the each cell in the each group by applying a variance of the SOC of the representative cell of the each group to an initial SOC value of the each cell.

The second SOC estimator may be configured to estimates the SOC of the battery pack using measures of central tendency of the SOC of the each cell.

The apparatus may include an eccentric cell detector configured to detect an eccentric cell from the cells based on a result of cell clustering.

The eccentric cell detector may be configured to detect, as the eccentric cell, a cell that has not been classified into the groups, or has continuously changed its group according to the group update intervals.

The apparatus may include a calibrator configured to calibrate the SOC of the representative cell of the each group.

In another general aspect, there is provided a method for battery state of charge (SOC) determination, the method including clustering cells in a battery pack into groups based on similarity of sensing data among the cells, selecting a representative cell of each group, estimating a SOC of the representative cell of each group based on a battery model, and determining a SOC of the battery pack based on the SOC of the representative cell of the each group.

The sensing data of each of the cells may include any one or any combination of a current, a voltage, and a temperature of the each cell.

The clustering of the cells may be performed at designated group update intervals.

The selecting of the representative cell of the each group may be performed at designated representative cell update intervals.

The selecting of the representative cell of each group may include numbering the cells in a group and selecting each of the numbered cells in turn as the representative cell at the representative cell update intervals, or randomly selecting a cell from the each group as the representative cell at the representative cell update intervals.

The battery model may include either an electric circuit model or an electro-chemical model.

The determining of the SOC of the battery pack may include estimating a SOC of each cell in the each group based on the estimated SOC of the representative cell of the each group, and determining the SOC of the battery pack based on the SOC of the cells and the SOC of the each of the representative cells.

The determining of the SOC of the each cell in the each group may include estimating the SOC of the each cell by applying a variance of the SOC of the representative cell of the each group to an initial SOC value of each of the each cell.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or apparatuses described herein. However, various changes, modifications, and equivalents of the methods, apparatuses, and/or apparatuses described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or apparatuses described herein that will be apparent after an understanding of the disclosure of this application.

Figure 1:
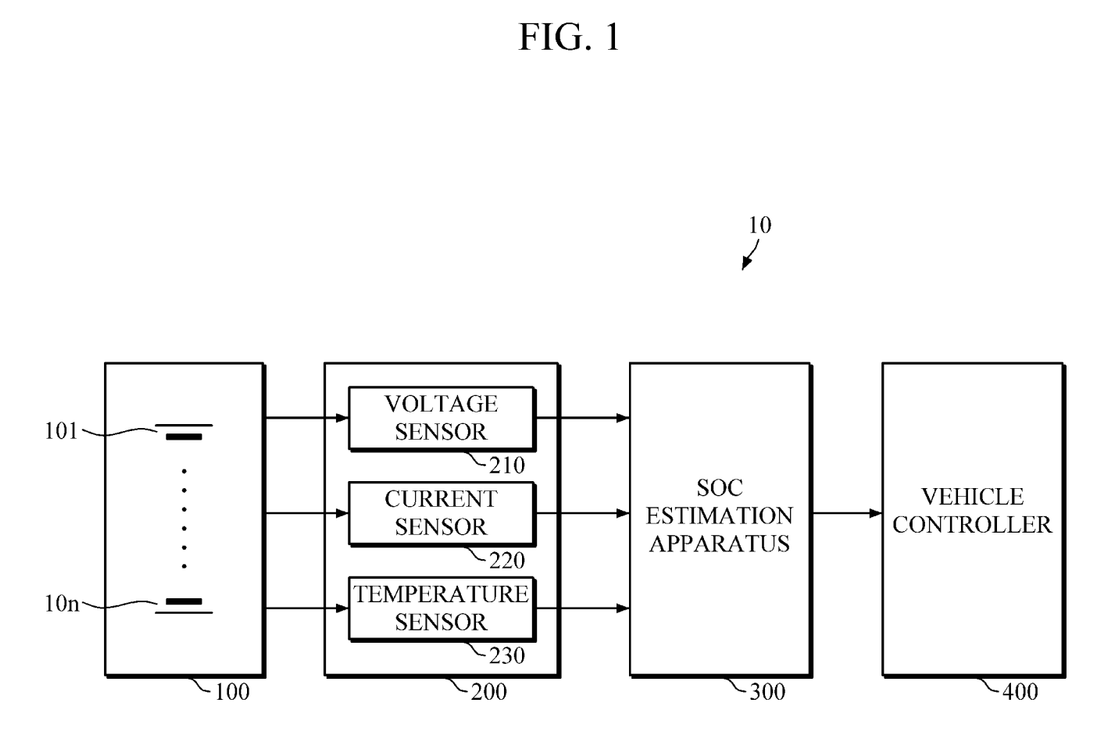
FIG. 1 is a diagram illustrating an example of an apparatus for a state of charge (SOC) estimation of batteries.

FIG. 1 is a diagram illustrating an example of an apparatus for a state of charge (SOC) estimation of batteries 10.

Referring to FIG. 1, the apparatus 10 includes a battery pack 100, a sensor 200, an SOC estimation apparatus 300, and a vehicle controller 400.

In an example, the battery pack 100 includes a plurality of battery cells 101 to 10$n$ (hereinafter, will be referred to as "cells") which are connected to one another serially or in parallel. In an example, each cell 101 to 10$n$ may be a hybrid battery, such as nickel metal battery and a lithium-ion battery. Other types of cells, such as, for example lithium-ion phosphate battery may be used without departing from the spirit and scope of the illustrative examples described. For the ease of understanding, the battery pack 100 is illustrated as including only a single pack in FIG. 1, but it may consist of multiple sub-packs.

In an example, the sensor 200 senses the current, voltage, and temperature of each cell 100 to 10$n$ in the battery pack 100. In an example, the sensor 200 includes a voltage sensor 210, a current sensor 220, and a temperature sensor 230.

In an example, the current sensor 220 may be a Hall current transformer (CT) that measures current using a Hall element and outputs an analog current signal that corresponds to the measured current. However, aspects of the present disclosure are not limited to the above current sensor, and any elements that can sense current may be applicable.

The SOC estimation apparatus 300 may estimate a SOC of the battery pack 100 based on the voltage, current, and temperature of each cell 101 to 10$n$ measured by the sensor 200.

The SOC estimation apparatus 300 will be described in detail with reference to FIG. 2.

Based on the SOC of the battery pack 100, the vehicle controller 400 may control a main apparatus needed for driving a plug-in hybrid vehicle or an electric vehicle, so that the main apparatus maintains an optimal condition. To this end, the vehicle controller 400 may receive a SOC of the battery pack 100 from the SOC estimation apparatus 300 through a controller area network (CAN) communication in a vehicular environment. In other examples, the transmitter 230 use any wireless communication or network communication consistent with that disclosed herein.

Although the SOC estimation apparatus 300 is illustrated as being applied to a vehicle in FIG. 1, aspects of the present disclosure are not limited thereto, such that the SOC estimation apparatus 300 is applied to any device that uses a multi-cell battery. In an example, the SOC estimation apparatus 300 may be embedded in or interoperate with various digital devices such as, for example, a mobile phone, a cellular phone, a smart phone, a wearable smart device (such as, for example, a ring, a watch, a pair of glasses, glasses-type device, a bracelet, an ankle bracelet, a belt, a necklace, an earring, a headband, a helmet, a device embedded in the cloths), a personal computer (PC), a laptop, a notebook, a subnotebook, a netbook, or an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device or portable navigation device (PND), a handheld game console, an e-book, and devices such as a high definition television (HDTV), an optical disc player, a DVD player, a Blue-ray player, a setup box, robot cleaners, a home appliance, content players, communication systems, image processing systems, graphics processing systems, other consumer electronics/information technology (CE/IT) device, or any other device capable of wireless communication or network communication consistent with that disclosed herein. The digital devices may be may be embedded in or interoperate with a smart appliance, an intelligent vehicle, an electric vehicle, a hybrid vehicle, a smart home environment, or a smart building environment.

Figure 2:
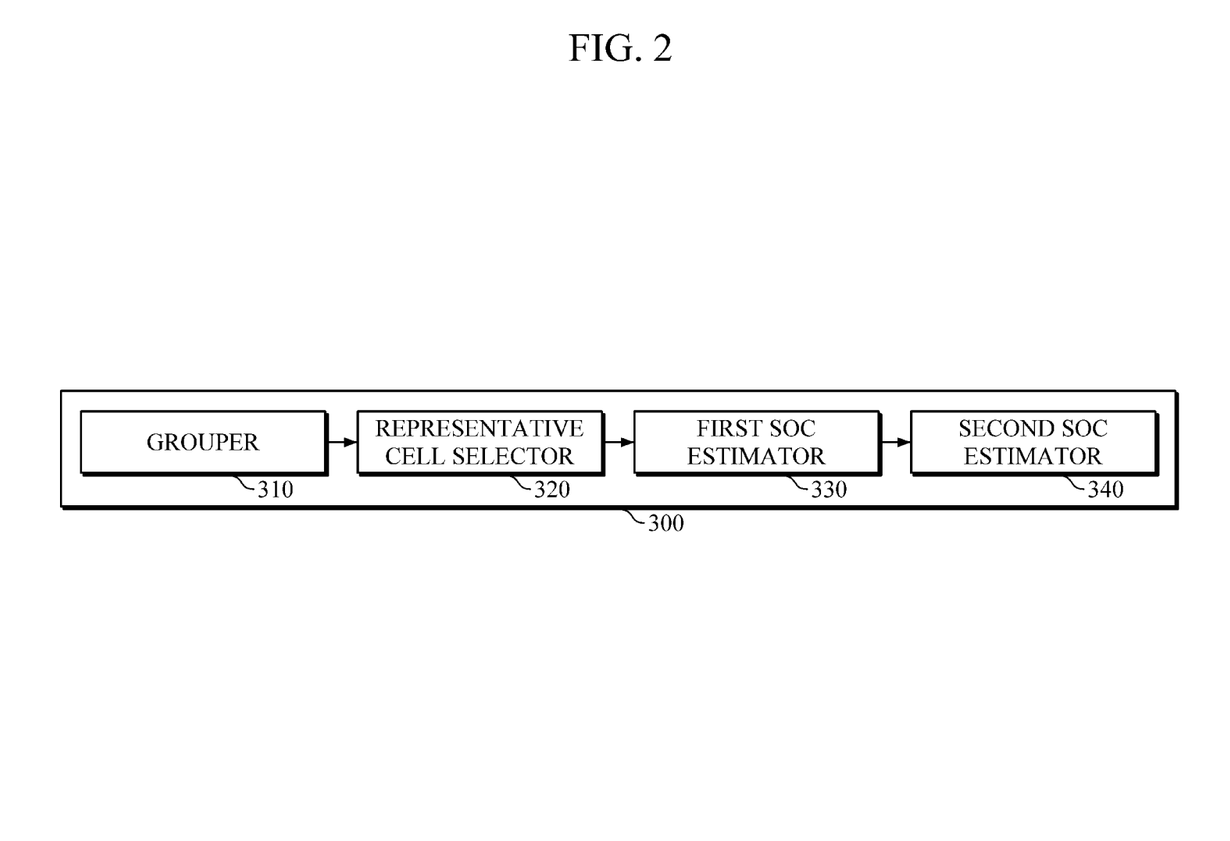
FIG. 2 is a diagram illustrating an example of the SOC estimation apparatus shown in FIG. 1.

FIG. 2 is a diagram illustrating an example of the SOC estimation apparatus shown in FIG. 1. Referring to FIG. 2, the SOC estimation apparatus 300 includes a grouper 310, a representative cell selector 320, a first SOC estimator 330, and a second SOC estimator 340.

In an example, the grouper 310 analyzes a pattern of sensing data (a voltage, a current, and a temperature) of each cell 101 to 10n which are received from the sensor 200 and divide the cells 101 to 10n into groups according to an interval (hereinafter, referred to as a "group update interval"). In an example, the interval is predetermined.

The grouper 310 categorizes the cells 101 to 10n into groups using various clustering algorithms, such as, for example, a single-link algorithm, an average-link algorithm, a minimum spanning tree (MST)-based single-link algorithm, a K-means algorithm, a nearest neighbor algorithm. The grouper 310 may analyze the pattern similarity among voltages, currents, and temperatures of the cells 101 to 10n and use various clustering algorithms to group similar cells 101 to 10n together.

In another example, the grouper 310 categorizes the cells 101 to 10n by indexing information of each cell 101 to 10n, for example, a temperature change, an average temperature, a voltage change, an average voltage, a current change, and an average current, and group the cells based on the result of the classification.

The group update interval may be an interval at which cells are divided into groups. In an example, the group update interval may be one day, but aspects of the present disclosure are not limited thereto, the group update interval may vary according to the performance and usage of an apparatus.

The representative cell selector 320 of the SOC estimation apparatus 300 may select a representative cell of each group of cells according to designated intervals (hereinafter, referred to as "representative cell update intervals"). For example, the representative cell selector 320 may number the cells in a respective group, and select each of the numbered cells in turn to set the selected cell as a representative cell at the representative cell update intervals. In another example, the representative cell selector 320 may randomly select one cell from each group as a representative cell at the representative cell update intervals. In another example, the representative cell selector 320 selects the cell that exhibits the average value of all properties of each group as a representative cell.

The representative cell update interval may be an interval at which a representative cell is selected and/or changed for each group. In an example, the representative cell update interval may be one minute or one hour. In an example, the representative cell update interval may coincide with the group update interval. However, aspects of the present disclosure are not limited thereto, such that the representative cell update interval may be set differently according to the performance and usage of the apparatus.

In an example, the first SOC estimator 330 estimates, through a battery model, the variance in SOC/voltage of the representative cell of each group during a unit time period based on information about the voltage, current, and temperature of the representative cell of each group. In an example, the first SOC estimator 330 estimates the SOC of the representative cell of each group based on the SOC/voltage variance estimate. In an example, the battery model may be either an electric circuit model or an electro-chemical model.

The electric circuit model models the electrical properties, such as resistance, impedance of a battery. The electro-chemical model models physical phenomena (Li ion diffusion) in the positive and negative poles and electrolyte of a battery. Any SOC estimation methods by use of the electric circuit model and the electro-chemical model may be applied, and hence the detailed descriptions thereof will be omitted.

In an example, the second SOC estimator 340 estimates a SOC of each member cell in each group based on the SOC/voltage variance estimates for the representative cells of the respective groups. The second SOC estimator 340 may estimate the SOC of each member cell in a group by applying the variance of SOC/voltage of the representative cell in each group to an initial SOC value (or a previously estimated SOC value) of each member cell in the group. The second SOC estimator 340 estimates a SOC of the battery pack based on the SOCs of a representative cell and each member cells in a respective group.

The second SOC estimator 340 estimates a SOC of each group based on the SOCs of a representative cell and each member cell of a group, and then estimate the SOC of the battery pack based on the SOCs of the respective groups. In an example, the second SOC estimator 330 may estimate the SOC of each group and the SOC of the battery pack using measure of central tendency, such as, for example, arithmetic mean, weighed mean, median, mode. For example, the second SOC estimator 330 may estimate the SOC of each group using the measure of central tendency of the SOC of each cell in each group, and may estimate the SOC of the battery pack using the measure of central tendency of the SOC of each group. The second SOC estimator 340 may consider the SOC of the representative cell of each group as the SOC of that group.

In another example, the second SOC estimator 340 estimates a SOC of the battery pack based on a SOC of each cell in the battery pack, without estimating the SOC of each group. The second SOC estimator 330 estimates the SOC of the battery pack using the measure of central tendency of the SOC of each cell. In another example, the second SOC estimator 340 may estimate the SOC of the battery pack by assigning a weight to the cell that has a lower SOC value.

FIGS. 3A to 3E are diagrams illustration examples of the application of the SOC estimation apparatus of FIG. 2 for estimating a SOC of a battery. FIGS. 3A to 3E assumes that the SOC estimation apparatus 300 estimates the SOC of the battery pack 100 that comprises seven cells 101 to 107.

Referring to FIGS. 2, and 3A to 3E, the grouper 310 analyzes a pattern of voltage, current, and temperature of each cell 101 to 107, and group the cells into three groups, Group 1, Group 2, and Group 3, using any of the clustering algorithms described above. Group 1 consists of cells 101 and 103, Group 2 consists of cells 102, 106, and 107, and Group 3 consists of cells 104 and 105. The groups may be re-grouped at the group update intervals.

The representative cell selector 320 selects cell 101 as a representative cell for Group 1, selects cell 106 as a representative cell for Group 2, and selects cell 105 as a representative cell for Group 3. The representative cell of each group may be changed at the representative cell update intervals. The representative cell selector 320 may number the cells in each group and select each of the numbered cells to set the selected cell as the representative cell of the corresponding group at the representative cell update intervals. The representative cell selector 320 may randomly select any cell of each group as a representative cell at the representative cell update intervals, or may select the cell that exhibits an average value of all properties of its group as a representative cell.

Figure 3A:
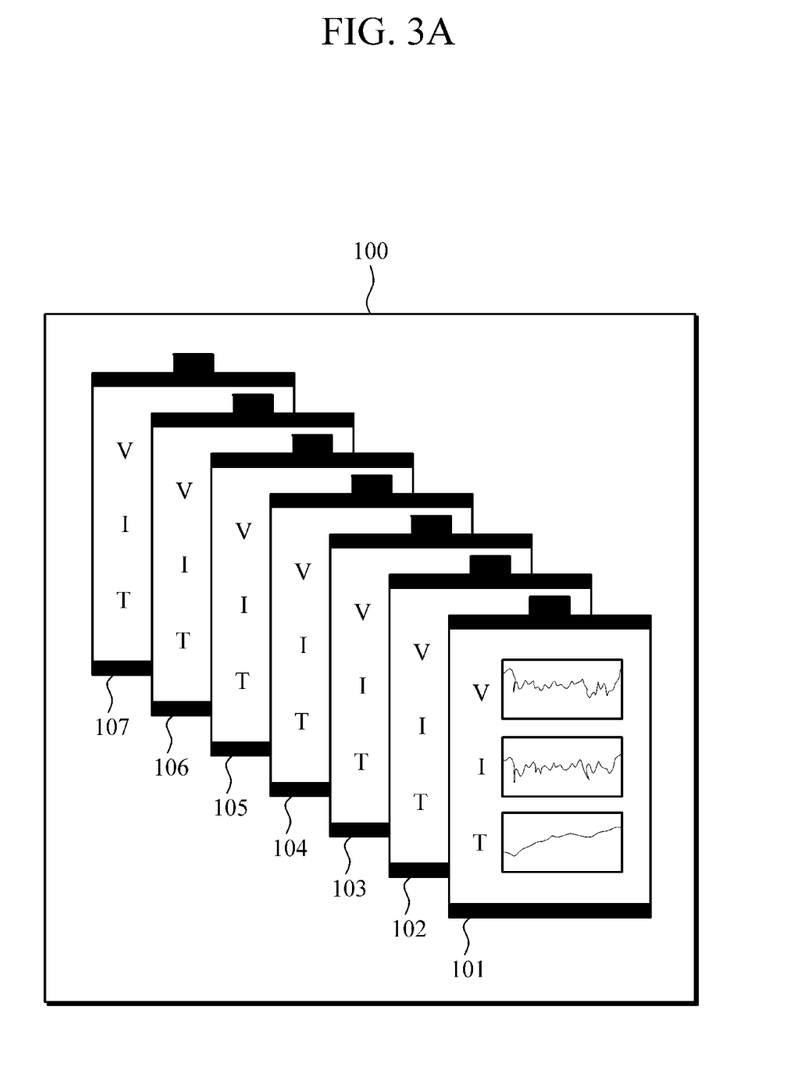
FIGS. 3A to 3E are diagrams illustrating examples of procedures of the SOC estimation of a battery.
Figure 3B:
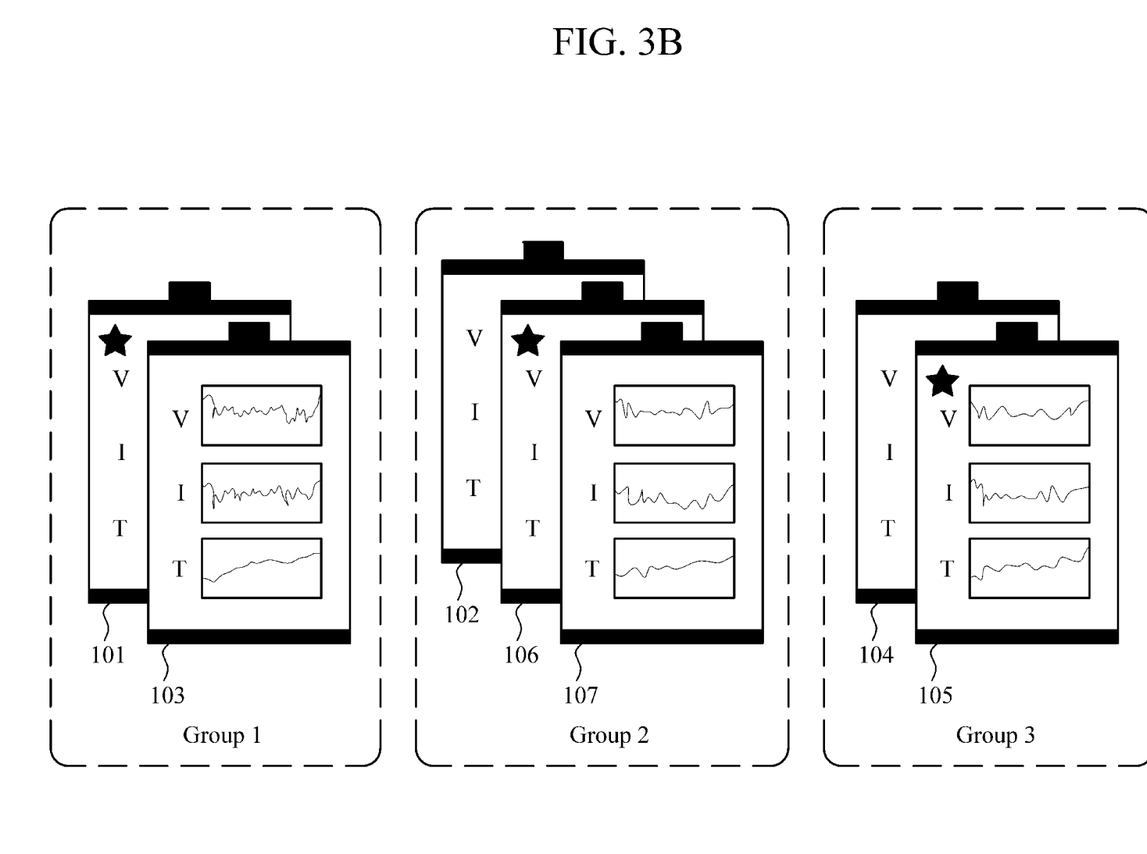
Figure 3C:
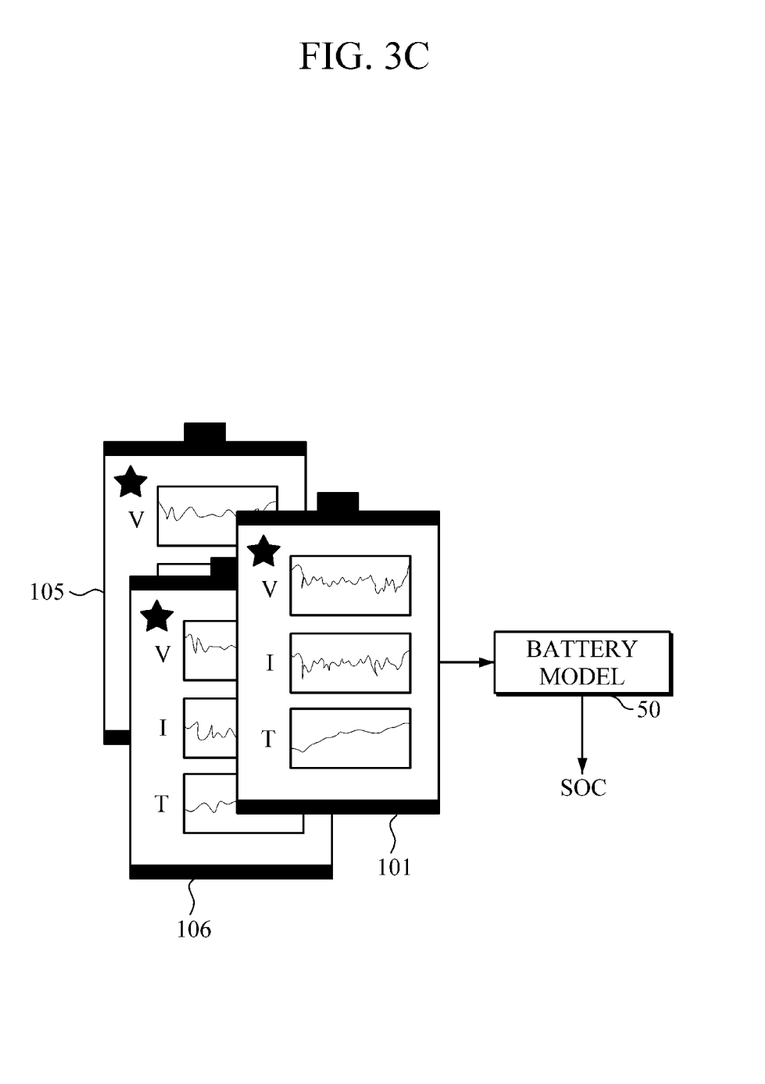

As shown in FIGS. 3B and 3C, based on the battery model 50, the first SOC estimator 330 estimates the SOC/voltage variance and SOC (hereinafter, referred to as "SOC1") of the representative cell 101 of Group 1, the SOC/voltage variance and SOC (hereinafter, referred to as "SOC6") of the representative cell 106 of Group 2, and SOC/voltage variance and SOC (hereinafter, referred to as "SOC5") of representative cell 105 of Group 3.

Figure 3D:
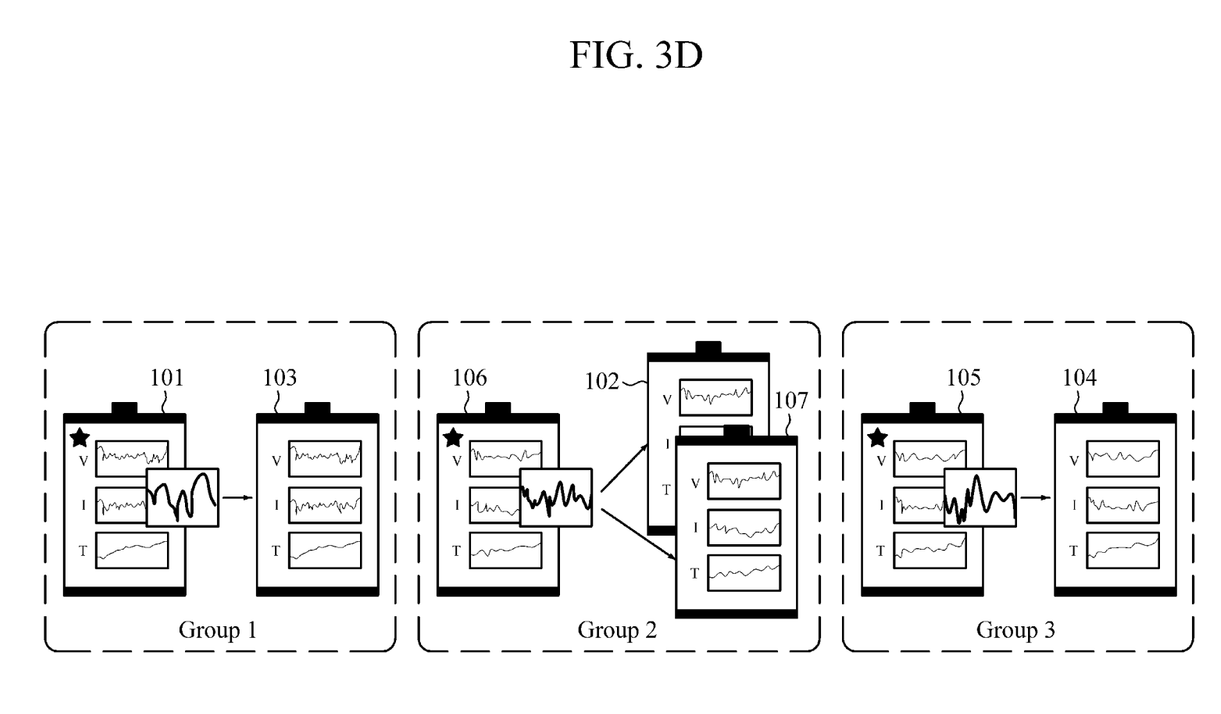

As shown in FIG. 3D, the second SOC estimator 340 estimates a SOC (hereinafter, referred to as "SOC3") of member cell 103 of Group 1 based on the SOC/voltage variance estimate of representative cell 101 of Group 1, estimates a SOC (hereinafter, referred to as "SOC2") of member cell 102 of Group 2 based on the SOC/voltage variance estimate of representative cell 106 of Group 2, a SOC (hereinafter, referred to as "SOC7") of member cell 107 based on the SOC/voltage variance estimate of representative cell 106 of Group 2, and estimates a SOC (hereinafter, referred to as "SOC4") of member cell 104 of Group 3 based on the SOC/voltage variance estimate of representative cell 105 of Group 3.

Figure 3E:
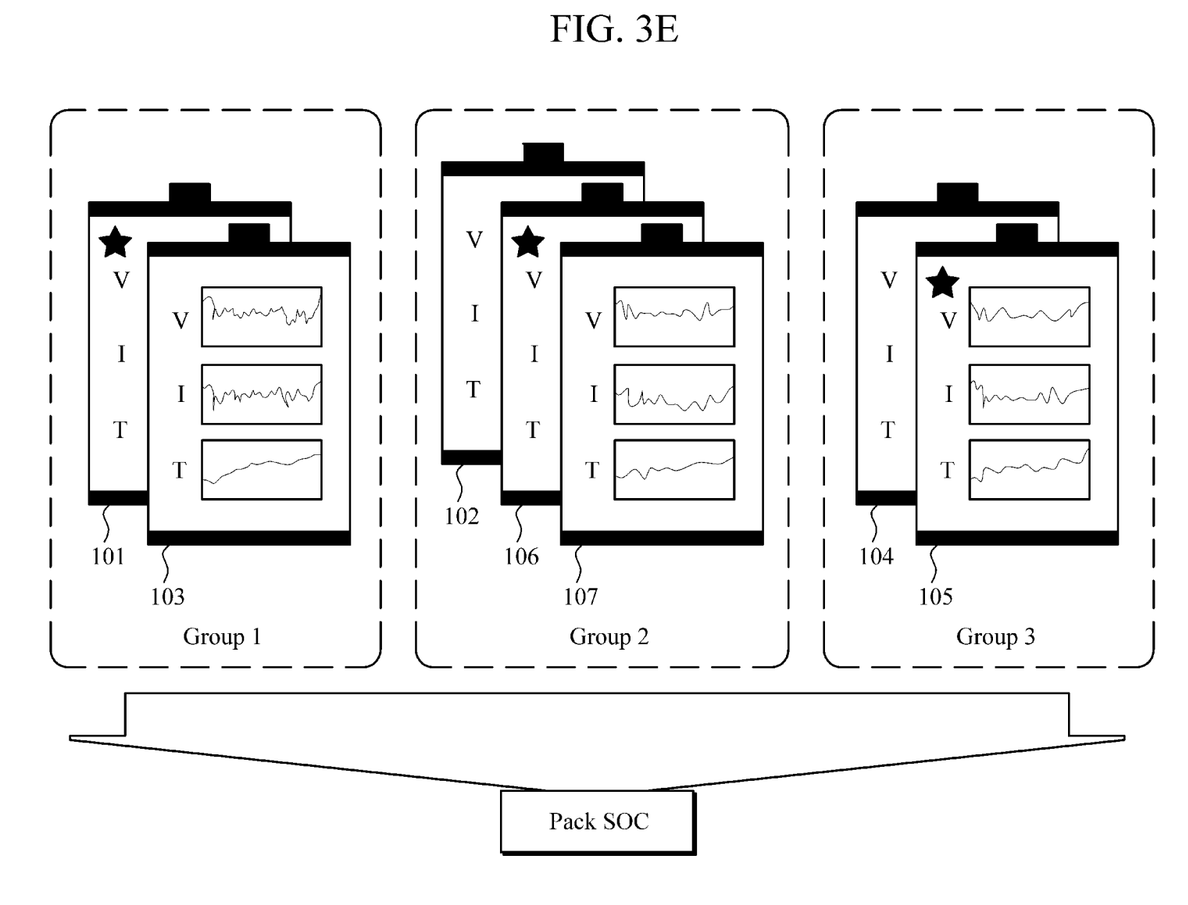

The second SOC estimator 340 estimates the SOC of the battery pack based on SOCs (i.e., SOC1 to SOC7) of the respective cells 101 to 107. The second SOC estimator 340 may estimate a SOC of each group based on SOCs of cells in each group, and estimate the SOC of the battery pack based on the estimated SOC of each group. In another example, the second SOC estimator 340 estimates the SOC of the battery pack 100 based on the SOCs (SOC1 to SOC7) of the respective cells 101 to 107, without estimating the SOC of each group. In this case, the second SOC estimator 340 may estimate the SOC of each group and/or the SOC of the battery pack using the measure of central tendency. In another example, the second SOC estimator 340 may estimate the SOC of the battery pack by assigning a weight to the cell that has a lower SOC value.

Figure 4:
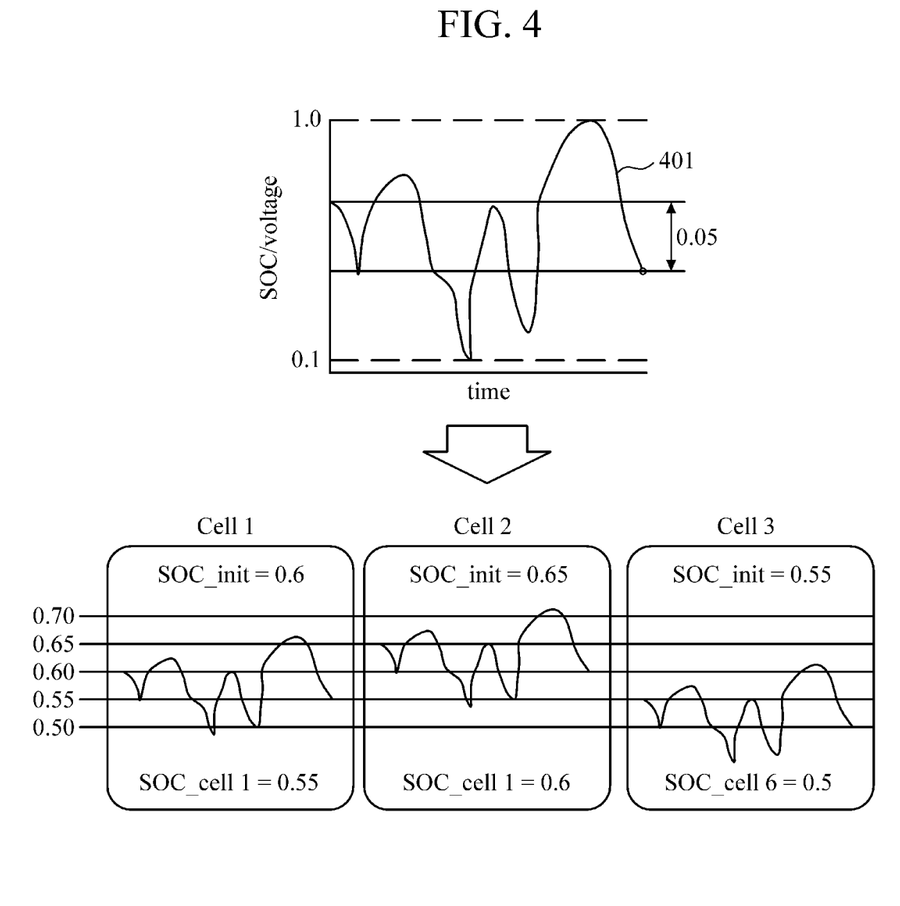
FIG. 4 is a diagram illustrating an example of a method of estimating a SOC of member cell in each group.

FIG. 4 illustrates an example of a method of estimating a SOC of member cell in each group. For ease of explanation, FIG. 4 assumes that each group includes four cells.

Referring to FIGS. 2 and 4, the first SOC estimator 330 estimates, through a battery model, a SOC/voltage variance of a representative cell of each group during a unit time period, based on information about the voltage, current, and temperature of the representative cell during the unit time period. Reference numeral 401 denotes a SOC/voltage variance of a representative cell of a specific group. In the example shown in FIG. 4, a SOC value of the representative cell of the specific group is reduced by 0.05 from the initial SOC value during the unit period of time.

The second SOC estimator 340 determines that the SOC value of member cell 1 after the unit period of time is 0.55 by applying the SOC/voltage variance of the representative cell of the same group, i.e., −0.05, to the initial SOC value, i.e., 0.6, of said member cell 1. The second SOC estimator 340 determines that the SOC value of member cell 2 after the unit period of time is 0.6 by applying the SOC/voltage variance of the representative cell to the initial SOC value, i.e., 0.65, of the member cell 2. The second SOC estimator 340 determines that the SOC value of member cell 3 after the unit period of time is 0.5 by applying said SOC/voltage variance of the representative cell to the initial SOC value, i.e., 0.55, of the member cell 3.

Figure 5:
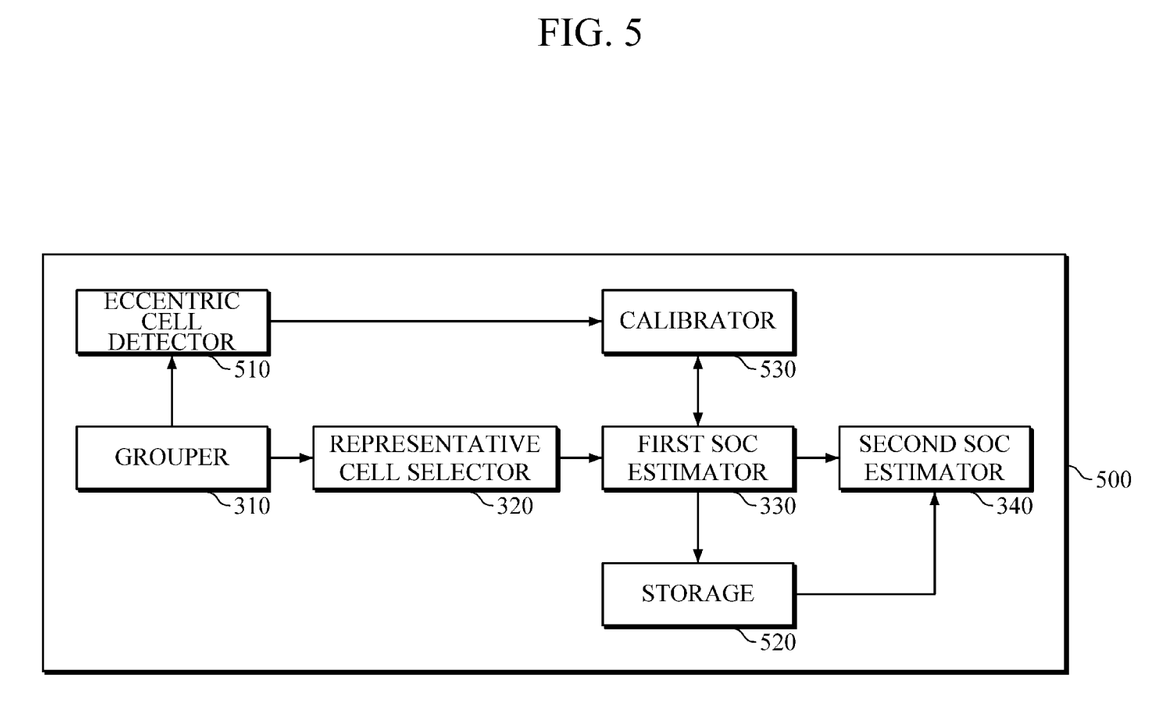
FIG. 5 is a diagram illustrating an embodiment of the SOC estimation apparatus of FIG. 1.

FIG. 5 is a diagram illustrating an embodiment of the SOC estimation apparatus of FIG. 1. Referring to FIG. 5, the SOC estimation apparatus 500 includes an eccentric cell detector 510, a storage unit 520, and a calibrator 530 in addition to the elements of the SOC estimation apparatus 300 shown in FIG. 2.

The eccentric cell detector 510 may detect a cell that has not been classified into any groups, such as, for example, a cell with a much higher or lower voltage or with a much higher or lower temperature, or a cell that has continuously changed its group according to the group update interval as an eccentric cell. Such detected cells are susceptible to deteriorate and malfunction, and are managed by the SOC estimation apparatus 500.

In an example, the calibrator 520 calibrates the SOC estimate of a representative cell of each group. The calibrator 520 may compare a sensed voltage and a voltage estimate from the battery model and, if a difference between the sensed voltage and the estimated voltage is not within a tolerance, the calibrator 520 may calibrate the SOC of the group's representative cell.

According to an embodiment, the calibrator 520 may calibrate the SOC of a representative cell of each group using Equation 1 to Equation 3 as shown below.

$$V_{correction} = \alpha \times V_{simulated} + (1 - \alpha) \times V_{measured} \quad (1)$$

$$SOC_{correction} = SOC_{simulated} + \Delta SOC \quad (2)$$

$$\Delta SOC = \frac{V_{correction} - V_{stimulated}}{V_{max\_limit} - V_{min\_limit}} \quad (3)$$

In Equation 1 to Equation 3, α denotes a constant of a designated value, $V_{max\_limit}$ is the maximum voltage limit, and $V_{min\_limit}$ is the minimum voltage limit.

According to another embodiment, the calibrator 520 may calibrate the SOC of each group's representative cell by adjusting parameters of the battery model so that the difference between the sensed voltage and the voltage estimate can be within the tolerance. In an example, the tolerance is specified. Calibration of the SOC estimate of each group's representative cell may be performed in various other ways, without departing from the spirit and scope of the illustrative examples described.

The storage unit 530 may store programs for processing and controlling the SOC estimation apparatus 500. For example, the storage unit 530 may store a program for the grouper 310 to execute pattern analysis on data (voltage, current and temperature data) and cell grouping, a program for the representative cell selector 320 to select a representative cell, a program for the first SOC estimator 330 to estimate a SOC of each groups representative cell, a program for the second SOC estimator 340 to estimate a SOC of the battery pack, a program for the eccentric cell detector 510 to detect an eccentric cell, and a program for the calibrator 520 to calibrate the SOC estimate of each group's representative cell.

In addition, the storage unit 520 may store results of various operations, such as, for example, a result regarding the representative cell selector 320 and its selection of representative cell, a result regarding the first SOC estimator 330 and its estimation of a SOC of the representative cell of each group, a result regarding the second SOC estimator 340 and its estimation of a SOC of the battery pack, a result regarding the eccentric cell detector 510 and its detection of an eccentric cell, a result regarding the calibrator 520 and its calibration of the SOC.

The storage unit 520 may include at least one of various types of storage media, such as, for example, flash memory, hard disk, multimedia card micro type storage medium, card-type memory (e.g., SD or XD memory), RAM, static RAM (SRAM), ROM, electrically erasable ROM (EEPROM), programmable ROM (PROM), magnetic memory, magnetic disk, optical data storage devices, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions.

Figure 6:
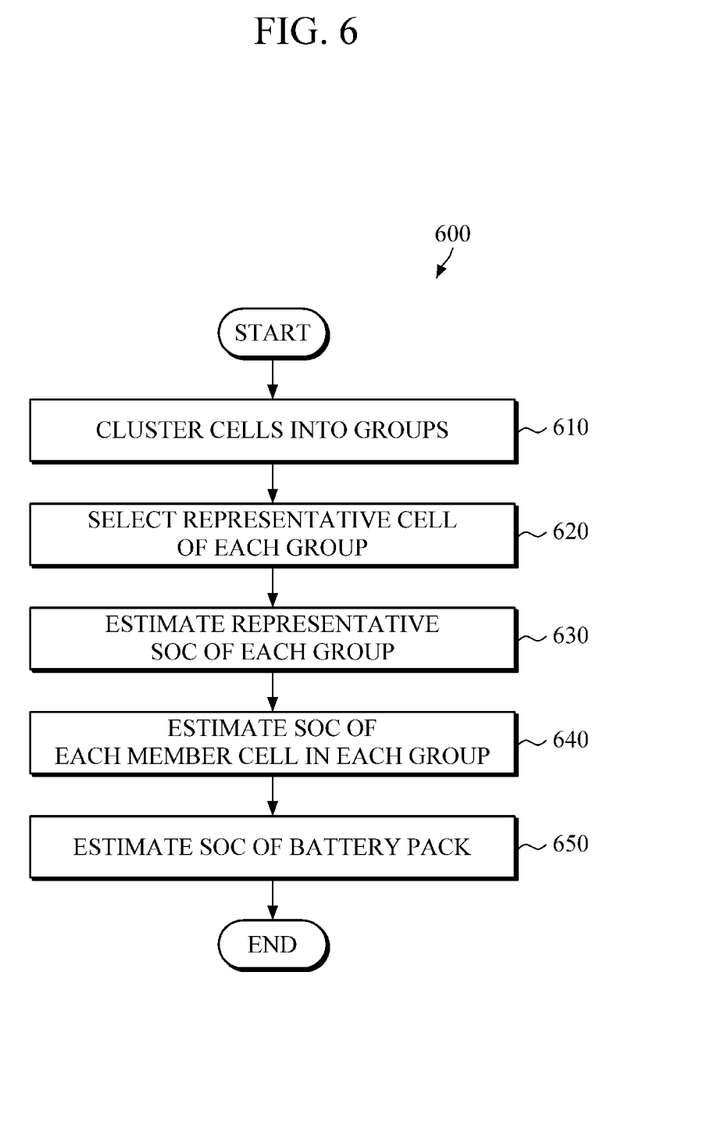
FIG. 6 is a diagram illustrating an embodiment of a method of SOC estimation of batteries.

FIG. 6 is a diagram illustrating an embodiment of a method of SOC estimation of batteries. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. In addition to the description of FIG. 6 below, the above descriptions of FIGS. 1-5, are also applicable to FIG. 6, and are incorporated herein by reference. Thus, the above description may not be repeated here.

Referring to FIGS. 2 and 6, in 610, the battery SOC estimation method 600 analyzes a pattern of sensing data (a voltage, a current, and a temperature) of each cell and groups the cells according to a group update interval. At In an example, the grouper 310 may cluster the cells into groups using various clustering algorithms mentioned above. The grouper 310 may analyze pattern similarity among voltages, currents, and temperatures of the cells using clustering algorithms, and group similar cells together.

In another example, the grouper 310 classifies the cells by indexing information of each cell, such as a temperature change, an average temperature, a voltage change, an average voltage, a current change, and an average current, and cluster the cells 101 to 10*n* into groups based on the result of the classification.

In an example, the group update interval is an interval at which cells are divided into groups.

In 620, a representative cell of each group is selected at representative cell update intervals. For example, the representative cell selector 320 numbers the cells in each group, selects each of the numbered cells in turn to set the selected one as the representative cell of its group at the representative cell update intervals. In an example, the representative cell selector 320 randomly selects any cell of each group as a representative cell at the representative cell update interval, or may select the cell that exhibits an average value of all properties of its group as a representative cell.

The representative cell update interval is an interval at which a representative cell is selected and/or changed for each group.

In 630, a SOC/voltage variance of the representative cell of each group during the unit time period is estimated through the battery model based on the data (a voltage, a current, and a temperature) of the representative cell of each group sensed during the unit time period, and a SOC of the representative cell of each group is estimated. In an example, the battery model may a model such as, for example, an electric circuit model or an electro-chemical model.

In 640, a SOC of each member cell in each group is estimated based on the SOC/voltage variance estimate of the representative cell in the corresponding group. The second SOC estimator 340 may estimate the SOC of each member cell in a respective group by applying the SOC/voltage variance of the representative cell of its corresponding group to an initial SOC value (or a previously estimated SOC value) of the member cell.

In 650, the SOC of the battery pack is estimated based on a SOC of each cell (representative cell and member cells).

For example, the second SOC estimator 340 may estimate a SOC of a respective group based on a SOC of the representative cell and member cells of each group, and estimate the SOC of the battery pack based on the SOC estimates of the respective groups.

The second SOC estimator 340 may estimate the SOC of each group and the SOC of the battery pack using the measures of central tendency as described above. The second SOC estimator 340 may estimate a SOC of each group using the measures of central tendency of the SOC of each cell, and estimate the SOC of the battery pack using the measures of central tendency of the SOC of each group. In addition, the second SOC estimator 340 may consider the SOC of the representative cell of each group as a SOC of that group.

In another example, the second SOC estimator 340 may estimate the SOC of the battery pack based on a SOC of each cell in the battery pack, without estimating the SOC of each group. The second SOC estimator 330 may estimate the SOC of the battery pack using the measure of central tendency of the SOC of each cell.

Figure 7:
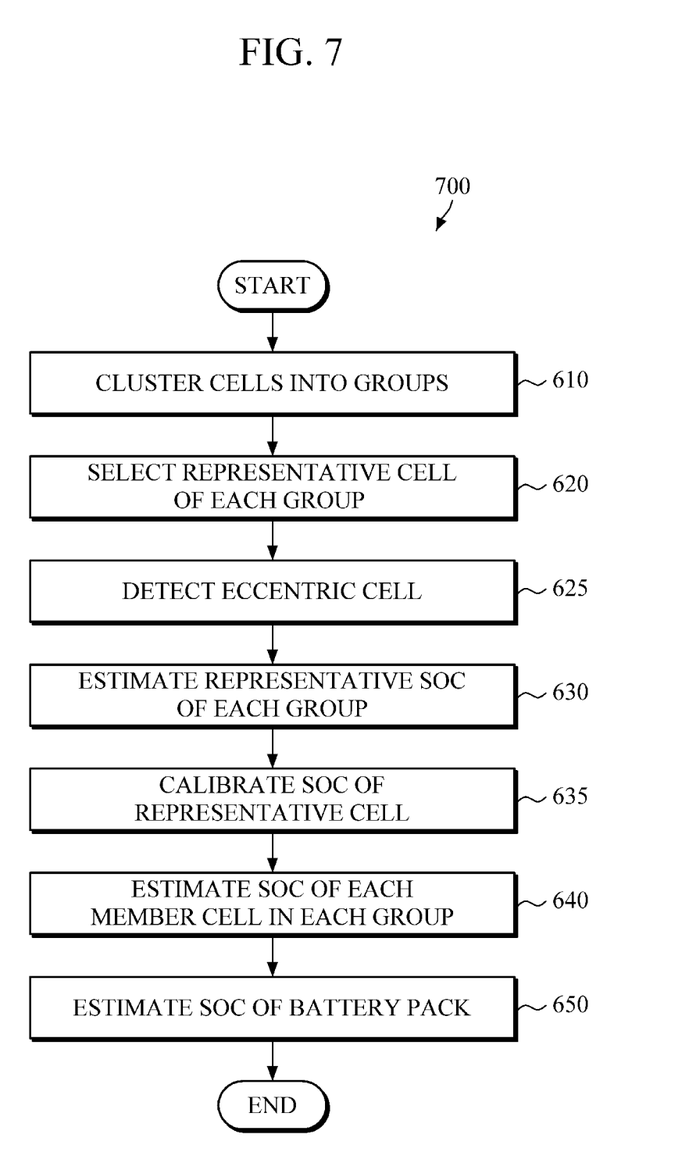
FIG. 7 is a diagram illustrating an embodiment of the battery SOC estimation method.

FIG. 7 is a diagram illustrating another embodiment of the battery SOC estimation method. The operations in FIG. 7 may be performed in the sequence and manner as shown, although the order of some operations may be changed or some of the operations omitted without departing from the spirit and scope of the illustrative examples described. Many of the operations shown in FIG. 7 may be performed in parallel or concurrently.

The battery SOC estimation method 700 shown in FIG. 7 includes operations of detecting an eccentric cell, as depicted in 625 and of calibrating a SOC of a representative cell, as depicted in 635, in addition to the operations of the SOC estimation method shown in FIG. 6. In addition to the description of FIG. 7 below, the above descriptions of FIGS. 1-6, are also applicable to FIG. 7, and are incorporated herein by reference. Thus, the above description may not be repeated here.

Referring to FIGS. 5 and 7, in 625, a cell that has not been classified into any groups (for example, a cell with a much higher or lower voltage or with a much higher or lower temperature), or a cell that has continuously changed its group according to the group update interval is detected as an eccentric cell. Such detected cells are more susceptible to deteriorate and malfunction, and can be managed by the SOC estimation apparatus 500.

In 635, the SOC estimate of a representative cell of each group is calibrated. At this time, the calibrator 520 may compare a sensed voltage and a voltage estimate from the battery model, and if a difference between the sensed voltage and the voltage estimate is not within a specific tolerance, may calibrate the SOC of the group's representative cell.

According to the embodiment, the calibrator 520 calibrates the SOC of each group's representative cell using Equation 1 to Equation 3 as shown above. In another example, the calibrator 520 calibrates the SOC of each group's representative cell by adjusting parameters of the battery model so that the difference between the sensed voltage and the voltage estimate can be within the specific tolerance.

The sensor 200, SOC estimation apparatus 300, vehicle controller 400, grouper 310, representative cell selector 320, first SOC estimator 330, second SOC estimator 340, SOC estimation apparatus 500, eccentric cell detector 510, storage unit 520, and calibrator 530 described in FIGS. 1-2 and 5 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 6-7 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. An apparatus for battery state of charge (SOC) determination, the apparatus comprising:
   a processor comprising:
      a grouper configured to analyze a variation pattern of sensing data of each cell in a battery pack and to cluster cells in the battery pack into groups based on a similarity of the variation pattern of the sensing data among the cells;

a representative cell selector configured to select a representative cell for each group among the groups;

a first SOC estimator configured to estimate a SOC of the representative cell of the each group based on a battery model; and a second SOC estimator configured to determine a SOC of the battery pack based on the SOC of the representative cell of the each group, wherein the second SOC estimator is further configured to estimate a SOC of each cell in the each group by applying a variance of the SOC of the representative cell of the each group to an initial SOC value of the each cell, and to determine the SOC of the battery pack based on the SOC of each of the cells and the SOC of the each of the representative cells.

2. The apparatus of claim 1, wherein the sensing data of each of the cells comprises any one or any combination of a current, a voltage, and a temperature of the each cell.

3. The apparatus of claim 1, wherein the representative cell selector is further configured to select the representative cell of the each group at designated representative cell update intervals.

4. The apparatus of claim 3, wherein the representative cell selector is further configured to either number the cells in a group and to select each of the numbered cells in turn as the representative cell at the representative cell update intervals, or to randomly select a cell from the each group as the representative cell at the representative cell update intervals.

5. The apparatus of claim 1, wherein the battery model comprises either an electric circuit model or an electrochemical model.

6. The apparatus of claim 1, wherein the second SOC estimator is further configured to estimate the SOC of the battery pack using measures of central tendency of the SOC of the each cell.

7. The apparatus of claim 1, further comprising:
an eccentric cell detector configured to detect an eccentric cell from the cells based on a result of cell clustering.

8. The apparatus of claim 7, wherein the eccentric cell detector is further configured to detect, as the eccentric cell, a cell that has not been classified into the groups, or has continuously changed its group according to the group update intervals.

9. The apparatus of claim 1, further comprising:
a calibrator configured to calibrate the SOC of the representative cell of the each group.

10. The apparatus of claim 1, wherein the grouper is further configured to cluster the cells into the groups at designated group update intervals.

11. A method for battery state of charge (SOC) determination, the method comprising:

analyzing a variation pattern of sensing data of each cell in a battery pack;

clustering cells in a battery pack into groups based on similarity of the variation pattern of sensing data among the cells;

selecting a representative cell of each group among the groups;

estimating a SOC of the representative cell of each group based on a battery model; and determining a SOC of the battery pack based on the SOC of the representative cell of the each group, wherein the determining of the SOC of the battery pack comprises estimating a SOC of each cell in the each group by applying a variance of the SOC of the representative cell of the each group to an initial SOC value of the each cell, and determining the SOC of the battery pack based on the SOC of each of the cells and the SOC of the each of the representative cells.

12. The method of claim 11, wherein the sensing data of each of the cells comprises any one or any combination of a current, a voltage, and a temperature of the each cell.

13. The method of claim 11, wherein the selecting of the representative cell of the each group is performed at designated representative cell update intervals.

14. The method of claim 13, wherein the selecting of the representative cell of each group comprises numbering the cells in a group and selecting each of the numbered cells in turn as the representative cell at the representative cell update intervals, or randomly selecting a cell from the each group as the representative cell at the representative cell update intervals.

15. The method of claim 11, wherein the battery model comprises either an electric circuit model or an electrochemical model.

16. A non-transitory computer-readable storage medium storing instructions that, when executed by a processor, cause the processor to perform the method of claim 11.

17. The method of claim 11, wherein the clustering of the cells is performed at designated group update intervals.

* * * * *